United States Patent [19]

Appeldorn et al.

[11] 4,146,883
[45] Mar. 27, 1979

[54] DISPLAY

[75] Inventors: Roger H. Appeldorn, White Bear Lake; Mao J. Chern, Woodbury, both of Minn.

[73] Assignee: Minnesota Mining and Manufacturing Company, Saint Paul, Minn.

[21] Appl. No.: 832,396

[22] Filed: Sep. 12, 1977

[51] Int. Cl.² .................................................. G09F 9/32
[52] U.S. Cl. .................................. 340/378.2; 313/510
[58] Field of Search ............................ 340/336, 378 R; 313/510, 512

[56] References Cited

U.S. PATENT DOCUMENTS

| 3,725,910 | 4/1973 | McNaney | 340/378 R |
| 3,858,341 | 1/1975 | Wakabayashi | 340/336 |
| 3,876,900 | 4/1975 | Amatsuka et al. | 313/510 |
| 3,911,430 | 10/1975 | Jankowski et al. | 340/378 R |
| 3,921,026 | 11/1975 | Konishi et al. | 313/510 X |
| 4,000,437 | 12/1976 | Lederhandler et al. | 313/510 X |
| 4,013,916 | 3/1977 | Brown | 313/510 |

Primary Examiner—David L. Trafton
Attorney, Agent, or Firm—Cruzan Alexander; Donald M. Sell; Robert C. Beck

[57] ABSTRACT

A display device having a plurality of information symbols for each light source such as an LED chip. The upper surface of each LED chip is divided into several light-emitting areas by a patterned array of electrically isolated, spaced electrodes. The LED chips are mounted to a substrate and can be selectively activated by a beam lead tape, which is also mounted to the substrate. A cover for the display forms thin, reflective light channels, each of which extends laterally from a light-emitting area to one or more optical openings in the cover. The optical openings form the information symbols. The lateral channels direct emissions from the LED chip to the openings via multiple reflection and optical dispersion to uniformly illuminate the openings.

16 Claims, 12 Drawing Figures

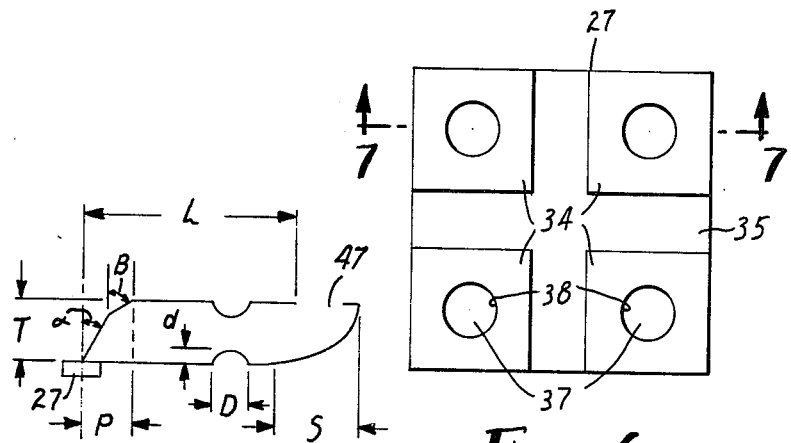
FIG. 12
FIG. 6
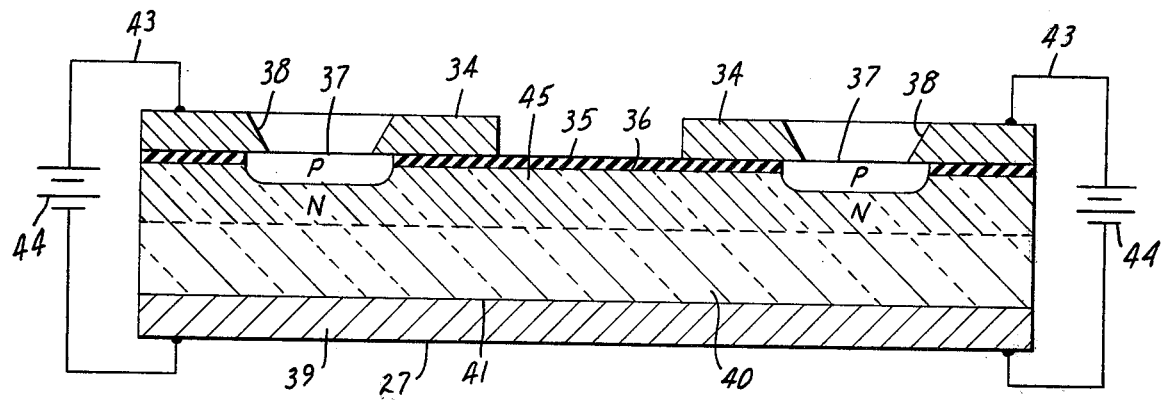
FIG. 7
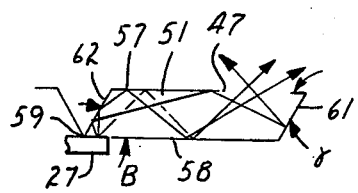
FIG. 9
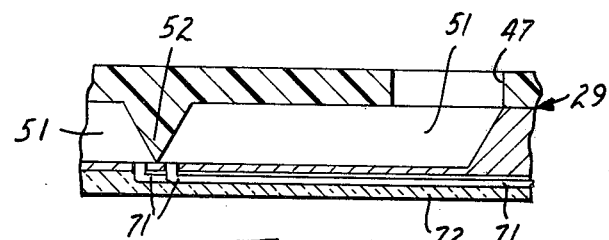
FIG. 11
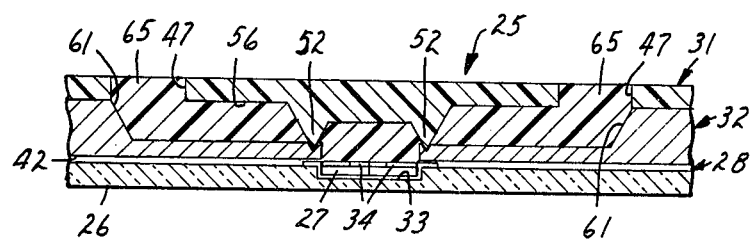
FIG. 10

DISPLAY

BACKGROUND OF THE INVENTION (1) Field of the Invention

The invention relates to illuminated information displays and, more particularly, to an improvement in information displays utilizing small light sources such as light-emitting diodes or fiber optic wave guides.

(2) Description of the Prior Art

Referring to FIG. 1, a typical prior art LED display 10 utilizes a vertical cavity 11 defined by walls 12 that channel light from an electroluminescent semiconductor or LED 13 to an optical opening 14. The opening forms at least part of an information symbol such as an alphabetic character or a numerical character.

Unfortunately, the illumination intensity of commonly used LED's, such as $GaAs_{1-x}P_x$ (gallium aresenide phosphide), is directional in nature. FIG. 2 shows a schematic representation of the relative intensity of light emitted from an upward-emitting LED 13 as a function of direction. LED's such as $GaAs_{1-x}P_x$ approximate a Lambertian radiation pattern in which luminous intensity varies as the cosine of the off-axis angle $\theta$: $I_\theta = I_O \cos\theta$, where $I_O$ is the on-axis intensity, i.e., the luminous intensity parallel to the axis, y, which is perpendicular to the LED upper surface 15. (For LED's such as GaP ($x = 1$; gallium phosphide), the emission pattern can deviate from the Lambertian pattern, but exhibits an even stronger directional property.) The on-axis intensity $I_O(\theta = 0°)$ is a maximum and drops off rapidly with increasing divergence from perpendicularity (that is, as $\theta$ increases). Thus, at angles of about 60° relative to the LED upper surface 15, the intensity is less than 0.5 $I_O$, and at about 75° to 80°, the illumination is practically nil. In short, the emitted light is directional, the greatest intensity is in the direction perpendicular to the LED light-emitting surface 15, and almost all of the emitted light is concentrated within about 60° of the perpendicular to the light-emitting surface.

Furthermore, for a typical flat optical opening, such as opening 14 in FIG. 1, the luminous intensity at a point in the opening can be approximated by $I_\theta = I_O \cos^2\theta$. Because of this $\cos^2\theta$ dependency, the illumination across the optical opening 14 is non-uniform and the central area of the opening, particularly center 16 thereof, tends to be much more brightly illuminated than the edges 17—17.

Several approaches have been undertaken in the prior art to increase the uniformity of illumination provided by LED displays. One approach is to make the walls 12 specularly reflective and to provide a randomly refracting surface (not shown), such as a fly's-eye lens, across the optical opening 14. However, this approach typically is incapable of completely eliminating the non-uniformity of illumination and requires an undesirably thick cavity 11.

The uniformity of illumination can also be increased by altering the dimensions of the LED cavity, but this also can result in a too-thick cavity. The light flux density along the opening 14 varies from $I_O$ down to $I_O\cos^2\alpha$, where $\theta = \alpha$, the angle subtended by lines directed from the LED surface 15 to the center 16 (axis "y" in FIG. 2) and to the edge 17 of the optical opening. As discussed above, the magnitude of the cosine$^2$ term and the magnitude of the light flux density decrease rapidly as $\theta$ increases. The angle $\alpha$ can be decreased by decreasing the width, w, of the opening 14 or by increasing the thickness, t, of the cavity 11. Decreasing the width, w, decreases the size and visibility of the display information. Increasing the thickness, then, may be the only way to enhance uniformity of illumination, but frequently results in an undesirably thick cavity.

Another approach is taught in U.S. Pat. No. 3,780,357, issued Dec. 18, 1973 to Haitz. Here, a transparent media containing light scattering particles (not shown) is introduced into the display cavity 11 to enhance diffusion. This approach utilizing light scattering centers increases uniformity, but the repeated refraction/reflection of the light reduces maximum intensity. Also, as will be readily appreciated, for a given concentration of scattering centers, the amount of scattering and, thus, the uniformity of the intensity are enhanced by increasing the cavity thickness. Consequently, as in the previously described approach, the thickness is frequently undesirably large and increasing the thickness to optimize uniformity is done at the expense of the intensity.

Another shortcoming of the aforementioned and other prior art devices is that they utilize cumbersome connecting wires or leads that can increase the size of the display. This increased size is at least partially offset in the case of U.S. Pat. No. 3,876,900, issued Apr. 8, 1975 to Amatsuka et al., by using a side-emitting LED and a lateral, transparent, resin-filled channel having an optical opening in the upper surface. Connecting wires are attached to the top of the side-emitting LED and a light diffracting mask is positioned over the LED to enhance the uniformity of light emission. The wires and the mask do increase the thickness of the device, but considerable size reduction apparently results from the side-emitting, lateral-channel design.

However, the resin channel used by Amatsuka et al. tends to decrease the light transmission, at least in part because light emitted at large angles relative to the resin channel-air interface is not totally reflected into the channel, but instead is partially transmitted through the interface. The design requires a separation between the resin channel and the mask to avoid false display. That is, if a light-transmissive mask sags against the channel, the resin-air interface is eliminated and light is transmitted through the region of channel-mask contact. Also, the surface of the resin must be optically flat to avoid light leakage. Finally, the cost of manufacturing such a device is increased by the use of side-emitting LED's, which are more expensive than conventional, upward-emitting LED's, and by the use of an LED chip for each character segment.

As may be appreciated from the foregoing discussion, it is highly desirable to have a light-emitting diode display that provides uniform illumination using a thin structure that does not require the use of complicating and expensive elements such as masks or shields or light scattering media. Furthermore, since the LED chip itself is the most expensive component of the display, it would be advantageous to decrease the cost of the chip by decreasing the size and/or the number of chips used.

SUMMARY OF THE INVENTION

The invention is a display device that provides illuminated symbols and comprises at least one source of illumination and a cover for the source that forms at least one laterally-extending optical channel. The cover has spaced, substantially parallel first and second light reflecting surfaces or walls, respectively, forming the inner and outer walls of a cavity, at least one optical opening formed in the outer wall, and at least one optical opening in the inner wall which is proximate to the source of illumination. The channel is formed by an array of three intersecting side surfaces or walls which extend between and enclose a volume of triangular, horizontal sections between the inner and outer walls. The outer wall opening is within the triangular area of the outer wall enclosed by the side walls adjacent to a first one of the three side walls and forms a display opening. A light-emitting region of the source is between the first and second side walls adjacent the intersection thereof. A light-dispersing surface or wall overlies the light-emitting region, extending between the first side wall and the second side wall and between the intersection point and the outer wall, and sloping outwardly of the channel from the intersection point to the outer wall.

The channel-defining inner and outer walls; first and second side walls; and light-dispersing wall preferably are specularly reflective to promote multiple reflections within the channel of light emitted by the source and to thereby increase the uniformity of light directed by the channel from the source to the display opening. The outwardly sloping, light-depressing wall is crucial to uniformity of illumination in that it disperses the directional light emitted from the LED and initiates propagation of the light along the channel. This wall may be a flat or substantially flat surface which is inclined outwardly, or a concave surface which curves outwardly. In the case of a concave surface which curves outwardly, the light diffusing end surface may have a matted finish mechanically impressed thereon or may be a magnesium oxide coated surface. When such a surface is made reflective, it provides a diffusing surface which aids in the uniformity of illumination at the optical opening. The optimum dimension for the width of the diffusing surface depends in part upon the refractive index of the material within the optical cavity. When the cavity is filled with an optically clear resin with an index of refraction equal to 1.5, the width S of this concave surface must be approximately equal to the cavity thickness T plus the width of the optical opening. Multiple reflections within the cavity and the uniformity of light intensity along the length of the optical opening are enhanced, without increasing the thickness of the device, by increasing the channel length (L) or decreasing the thickness (T) of the channel. The aspect ratio, R, of the cavity is defined as: $R = L/T$. Optimum efficiency lies within a region $8 > R > 5$. The preferred value of R is equal to 6. The larger this ratio, the more internal reflection which will occur within the cavity which reduces the overall efficiency due to reflection losses, while the smaller values of R lead to less uniformity of light emissions at the optical opening of the cavity.

Uniformity of light emissions from the optical opening of the device can be further enhanced by placing a rounded projection into the cavity from the channel defining first and second, inner or outer surfaces or walls. A projection may be placed in the inner or outer wall or a projection may be placed in both walls to achieve the desired effect. The diameter D of the dome-shaped projection should be between $1\frac{1}{2}$–$2\frac{1}{2}$ times the cavity thickness T. The height of the projection from the wall into the cavity should be between 25 and 50 percent of the cavity thickness T. Although a round hemispherically shaped dome is preferred, other continuous elongated surfaces of revolution may be used as well. In the case of two dome-shaped projections, the total height of the two projections should not exceed 50 percent of the channel thickness T. When this value is exceeded, the projection may tend to cast a shadow which can be seen at certain viewing angles.

In a preferred embodiment, the invention is an LED display device that provides illuminated symbols and comprises: a base; the source of illumination in the form of at least one electroluminescent semiconductor chip that has a plurality of light-emitting junctions and is supported on the base; a plurality of electrodes formed on a surface of the semiconductor chip and having apertures therein which define light-emitting regions on the chip; conductor means for connecting the light-emitting regions to a source of electrical signals; and the cover, which forms a plurality of laterally-extending optical channels and is supported on the base. Here, one of the light-emitting regions of the semiconductor chip is located proximate to the inner cover opening between the second and third side walls of a channel, for illuminating the channel display opening.

BRIEF DESCRIPTION OF THE DRAWINGS

The following description of the invention refers to the accompanying drawing wherein:

FIG. 6 is a plan view of an electroluminescent semiconductor chip that has a plurality of light-emitting areas and is incorporated in the display device of FIG. 3;

FIG. 7 is a cross-sectional view taken along the lines 7—7 in FIG. 6;

FIG. 9 is a longitudinal cross-section of one of the reflective, laterally-extending light channels of the display device of FIG. 3, showing representative paths of light along the channel;

FIG. 10 is a cross-sectional view similar to that of FIG. 5, but of a device having filled optical channels;

FIG. 11 is a longitudinal cross-sectional view of an alternative embodiment of the present invention, an illuminated display device utilizing an optical fiber illumination source and having the multi-channel arrangement of FIG. 3; and FIG. 12 is a longitudinal cross-section of one laterally-extending light channel, showing light diffusing projections in the channel.

DETAILED DESCRIPTION OF THE DRAWING

According to the present invention, a light-emitting display utilizes light channels that extend laterally from a source of illumination, such as a plurality of light-emitting areas on a semiconductor chip, to direct the emitted rays via multiple reflection to optical openings at the wall surface in the opposite ends of the channels.

Figure 1:
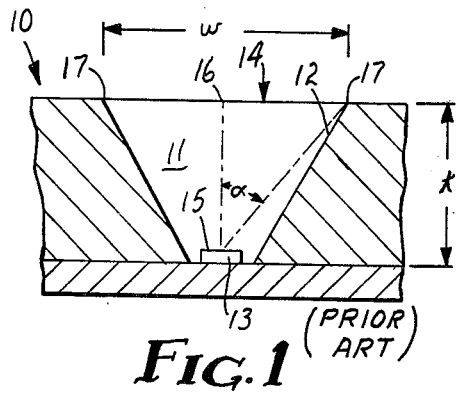
FIG. 1 is a cross-sectional view of a prior art LED display device.
Figure 3:
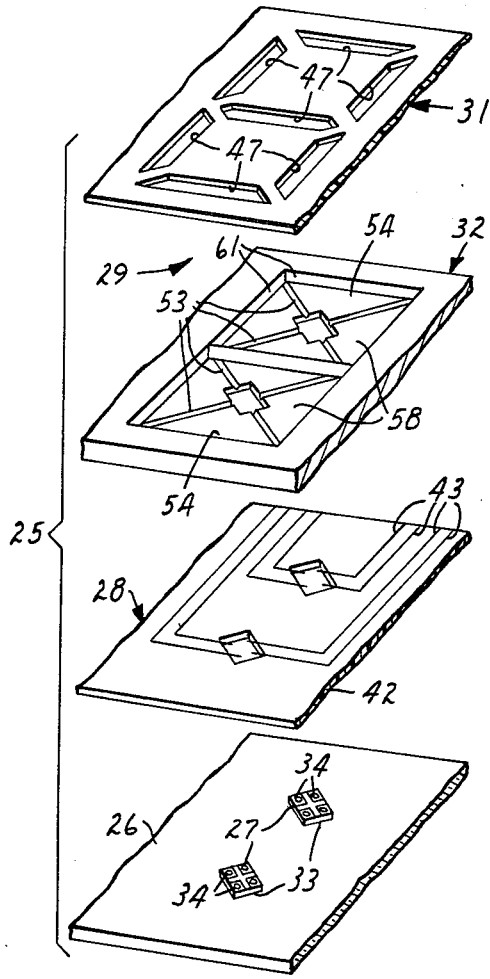
FIG. 3 is an exploded perspective view of a portion of a display device having a multi-channel illuminated symbol embodying principles of the present invention.
Figure 2:
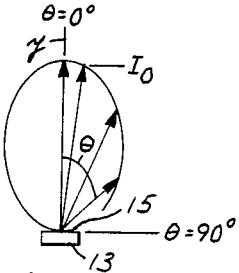
FIG. 2 is a representation of the variation of the intensity of light emitted from a $GaAs_{1-x}P_x$ LED chip having direction-dependent, Lambertian emission characteristics.

FIG. 3 is an exploded perspective view of a multichannel LED display device 25 that is an exemplary embodiment of the present invention and, typically, is one of a number of such devices which form a unitary electronic calculator display or the like. The device 25 comprises a substantially flat substrate 26 that mounts one or more electroluminescent semiconductor or light-emitting diode chips 27—27; a beam lead tape assembly 28 for connecting the chips to a source of electrical signals to activate the LED's for emitting light; and a cover assembly 29 comprising upper (outer) cover 31 and lower (inner) cover 32 for channeling the emitted light to openings in the outer cover 31 to provide illuminated symbols.

Figure 5:
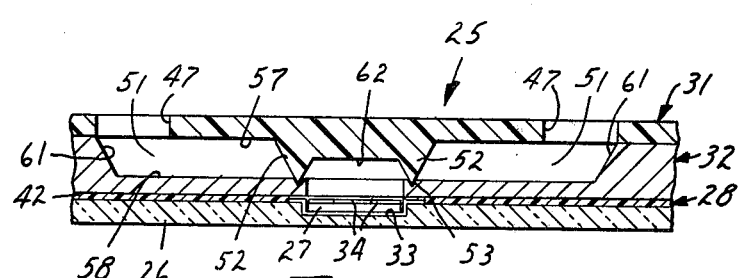
FIG. 5 is a cross-sectional view taken along the lines 5—5 in FIG. 4.

Referring also to the cross-sectional view of the device 25 shown in FIG. 5, the substrate 26 may have one or more recesses 33—33 formed therein (two are shown in FIG. 3) for receiving the LED chips 27—27 and precisely aligning the LED chips relative to the other components. Of course, the chips may be aligned and affixed to the substrate 26 without the recesses 33—33. Referring to the enlarged cross-sectional view of the chip 27 shown in FIG. 7, in an exemplary embodiment, but certainly not the only available one, the LED chip 27 has a GaAs substrate 40 and an overlying, epitaxial GaAsP layer 45.

Referring also to FIG. 6, in a preferred embodiment, each chip 27 has a plurality of electrodes 34—34 bonded to an insulating layer 35, such as silicon nitride, formed on the upper surface 36 of epitaxial layer 45. The electrodes 34—34 define light-emitting areas and provide electrical connections to the chip. That is, the electrodes 34—34 are of a conductive material, such as copper, gold or aluminum, which is formed into electrically isolated sections. Each section or electrode 34 is in electrical contact with a light-emitting region 37 (the region above one of the PN junctions of the semiconductor body) and circumscribes an opening 38 for the light-emitting region 37. Typically, a layer of conductive metal is formed on the LED surface 41 opposite the light-emitting upper surface 36 to provide a common electrode 39 (FIG. 7) for the plurality of light-emitting regions 37—37.

It should be noted that the chip 27 illustrated in FIG. 7 is light absorbing, so there is no light leakage between light emitting areas. Obviously, other light emitting semiconductor materials can be used for the chip 27. However, some suitable semiconductors, such as gallium phosphide (GaP), are transparent to the emitted light and may require isolation of the light emitting areas. Isolation can be done by locating mechanical louvers or light absorbing layers between the light emitting areas.

As shown in FIGS. 3 and 5, electrical connections are made to the individual electrodes 34—34 by the beam lead conductor tape assembly 28. The assembly 28 comprises a flexible insulating tape 42 of polyimide or similar material mounting a patterned array of conductors 43—43 that connect to the individual electrodes 34—34. A suitable beam lead tape is available from 3M Brand Microinterconnect Systems, Minnesota Mining and Manufacturing Company, St. Paul, Minnesota 55101. This tape comprises a flexible polyimide base of 0.013–0.125 mm (0.5–5 mil) thickness and copper conductors which are about 0.03–0.06 mm (1.4–2.8 mil) thick and 0.05 mm (2 mil) wide or wider. Signals from an electrical source or sources 44 (FIG. 7) may be selectively applied by the tape to activate the PN junction associated with a particular light-emitting region 37 (FIG. 7) for the emission of light.

Referring further to FIGS. 3 and 5, the light-channeling cover assembly 29 comprises substantially flat, planar outer cover portion and substantially flat, complementarily-shaped inner cover portion 32. The inner cover 32 mounts the outer cover 31 and is in turn affixed to the tape assembly 28 and/or the substrate 26. The outer cover 31 has optical openings 47-47 formed therein. The optical openings 47—47 may be of various shapes and may be arranged to cooperatively form any, or groups, of numerous symbols.

Figure 4:
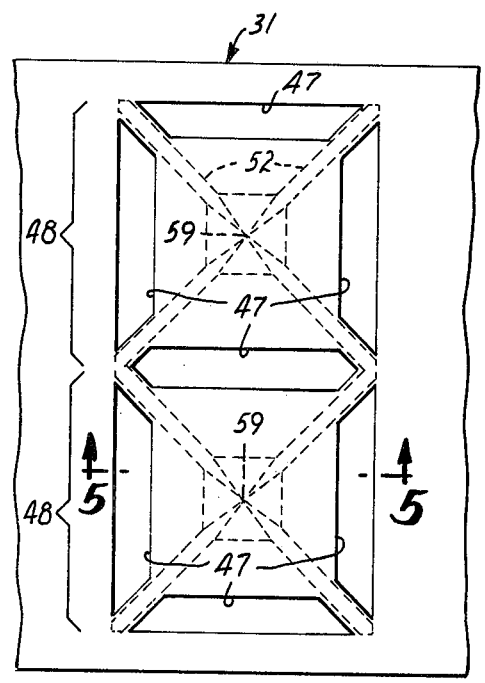
FIG. 4 is a plan view of the assembled display device of FIG. 3.

Referring still further to FIG. 3 and also to FIG. 4, in an exemplary embodiment, elongated optical openings 47—47 define the segments of two adjacent rectangular sections 48—48 of the figure-eight symbol that is widely used in electronic calculator displays, watch displays and the like. It is one of the advantages of the present invention that each section 48 utilizes a single LED chip 27 (FIG. 3) for four optical channels 51—51 (FIG. 5), each of which extends radially from the chip to a segment opening 47.

Figure 8:
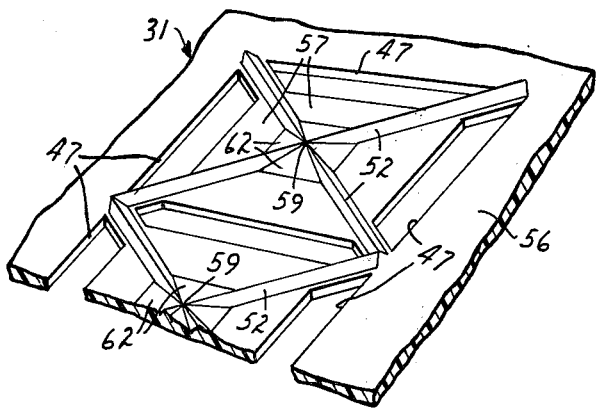
FIG. 8 is a view of the outer cover of the display device of FIG. 3 turned over to reveal the configuration of the bottom side thereof.

The optical channels 51—51 are uniquely formed by the cooperating outer and inner covers 31 and 32. FIG. 8 shows the outer cover 31 turned over to reveal its bottom or inner side 56. As shown, the cover 31 has downwardly extending ribs 52—52 that fit into slots or notches 53-53 (FIG. 3) formed in recesses 54—54 of the inner cover 32 to form the triangular-shaped channels 51—51. The ribs 52—52 divide inner surface 56 of the outer cover 31 into triangular-shaped outer surfaces or walls 57—57; the notches 53—53 shown in FIG. 3 likewise define recessed triangular areas defining the first inner surface or walls 58—58 in inner cover 32 which correspond to the triangular second outer cover areas or surfaces 57—57.

The walls 57 and 58 form substantially parallel, triangular-shaped outer and inner walls of the channels, and the ribs 52—52 form two of the three side walls of each channel. That is, two of the ribs 52—52 intersect at 59 to form the apex of each channel so that the region adjacent the apex 59 and between the intersecting ribs 52—52 overlies a light-emitting region 38 of the semiconductor chip 27. The apex-forming ribs 52 extend radially outward from the apex 59 to the optical openings 47—47. The ends of the ribs 52—52 opposite the apex 59 abut sides 61—61 of the inner cover recesses 54—54. This completes the enclosure of the channels 51—51 so that an optical opening 47 lies within the triangular second outer wall 57 adjacent the end wall 61 of each channel.

To summarize the operation and advantages of the device 25, refer first to FIG. 7. As described previously, application of signals via the tape assembly conductors 43—43 and electrodes 34 and 39 activates the PN junction associated with a preselected light-emitting area 38 for the emission of light. As shown in FIG. 9, the emitted light is dispersed by outwardly angled wall 62 and is directed along the lateral, triangular-shaped channels 51—51 via multiple reflections and emerges from the optical opening 47—47. Because of the multiple reflections provided by the channels, the light at the openings 47—47 is surprisingly bright and uniform. Multiple reflection is enhanced by the multiplicity of reflecting surfaces provided by the triangular shape of the channel walls 57 and 58, the outwardly angled ribs or side walls 52—52 (FIG. 8) and the outwardly angled channel end wall 61 on inner cover 32.

The channel walls 52, 57, 58 and 62 preferably are specularly reflective, as by forming the covers 31 and 32 from material such as plastic, then depositing a reflecting coating thereon. Channel end walls 61 can be specularly reflective also, but for optimum uniformity of illumination at the openings 47, preferably have a light-diffusing surface such as a matt finish or MgO coating.

The optical openings 47—47 can be physical openings formed in outer cover 31. Alternatively, if the cover 31 is a reflective coated transparent material, the openings 47—47 can be areas which are devoid of reflective coating. The light-dispersing channel wall 62 is crucial to achieving uniform illumination of the optical opening 47. Referring to FIG. 8, the wall 62 forms a triangular surface which extends between the rib apex 59 and the outer wall 57 and between the two intersecting ribs 52—52 which form the side walls of the channel 51. As shown in FIG. 9, the wall 62 is adjacent (overlies) a light-emitting region 37 of the LED chip 13 and slopes outwardly from the apex 59 to the inner wall 57 of cover 31. (As used in reference to the light-dispersing wall 62, channel side walls 52—52, and channel end wall 61, "outwardly" means that the walls are directed outwardly of the channel, in the direction from the inner cover 32 to the outer cover 31.) The slope and triangular shape evenly disperse the directional LED light for propagation along the channel 51. Although shown in FIGS. 8 and 9 as a flat surface which is angled outwardly, the wall 62 can form a concave, outwardly curving surface.

As is well known, the length of optical channels, such as the channels 51—51, affects the number of reflections and, therefore, the light uniformity at the openings 47—47. Because the direction of propagation within the channels 51—51 is lateral rather than vertical, the length of the channels can be as long as is necessary to provide sufficient multiple reflections for uniformity, while still allowing the channel and the device to remain very thin. The thickness of the channels and the device can be as small as about 0.25 to 1.3 mm (10–50 mils) and 0.75 to 1.75 (30–70 mils), respectively, while providing display openings 47—47 of about 0.25 to 2.5 cm (0.1–1.0 in.). Referring to FIG. 9, for these small dimensions, optimum uniformity is achieved if both the angle $\beta$ between the walls 52 or 62 and the wall 58 and the angle $\alpha$ between the end wall 61 and wall 57 are about 45°–60°.

As shown in the alternate embodiment of FIG. 12, the wall surface may be formed by two surfaces, one triangular and one trapozoidal, defined by angles $\alpha$ and $\beta$. Experimentation has shown that angle $\alpha$ should be between 0° and 45° and $\beta$ should be between 45° and 60°. The surfaces may be approximated by continuous conical or convex surfaces and should extend beyond the end of the light-emitting region as shown by dimension P of FIG. 12.

The invention also utilizes the fact that the light flux of light-emitting diodes is proportional to $(i/A)^a$, where "i" is the current across the light-emitting junction, "A" is the area of the light-emitting region defined by the PN junction, and "a" is between about 1.2 to 1.5. Because of this, it is possible to divide each chip 27 into a plurality of relatively small light-emitting regions 37—37 without decreasing the flux emitted by each region. This decreases the number and/or the size of the LED chips. Furthermore, the small, light-emitting openings 38—38 are precisely defined without using a separate mask by using the electrodes 34—34 as both masks and electrical connectors. The precisely formed, patterned beam lead tape leads 43—43 facilitate making accurate connections to the small, closely spaced electrodes 34—34.

Although the invention has been described in terms of hollow optical channels 51, FIGS. 5 and 9, the channels may be filed with an optical-quality material such as clear resin. A filled channel is illustrated in FIG. 10, wherein the reference numeral 65 designates the filling material. The filled channel contributes to structural strength and increases light transmission by optically coupling the LED chip 27 to the channels 51—51.

Those skilled in the art will devise multi-channel configurations other than the exemplary figure-eight configuration. For example, a simple two-channel, two-opening configuration could be used to display a colon. As another example, consider the seven-segment, figure-eight array of FIG. 4 which utilizes only seven of eight light-emitting areas 37—37 available from the two LED chips 27—27 (FIG. 3). The spare light-emitting area could be optically connected to another optical opening in cover 31 to provide a decimal point, etc.

Furthermore, the display device is not limited to LED chips, but provides uniform display illumination using other light sources. For example, as shown in FIG. 11, an alternative embodiment 70 of the display device uses optical fibers 71—71 that are supported by a substrate 72 for transmitting light from a source or sources (not shown) to the multi-channel cover 29.

In short, the inventive multiple-channel device 25 provides bright, uniform illumination for LED displays and decreases the number of chips and the cost per device. This can be accomplished without the use of complicating and expensive features such as light-diffusing fillings or surfaces. Also, the device lends itself to automated manufacture in which the tape assembly 28 and/or the cover 29 are fed to the final assembly station in the form of continuous tapes.

Having described the inventive display device and a preferred embodiment thereof, what is claimed is:

1. In a display device having a source of illumination and light channeling means for directing light from the source to form illuminated display symbols, and wherein the light-channeling means comprises a cover for the source, the improvement wherein said cover comprises:

spaced, substantially parallel first and second walls, said first wall having at least one optical opening therein overlying the source and said second wall having at least one optical opening therein, at least one optical channel formed between said first wall and said second wall, said channel being formed by an array of three intersecting walls that form first and second side walls and an end wall to enclose triangular-shaped areas of said first wall and said second wall, said first wall opening being within the triangular-shaped area thereof and the source of illumination being between the intersection point of said first side wall and said second side wall, and said second optical opening being in said second wall adjacent said end wall, and a light-dispersing wall spanning between said first side wall and said second side wall and between said intersection point of said side walls and sloping outwardly toward said end wall.

2. The display device of claim 1, wherein said light-dispersing wall is concave and curves outwardly from said first wall to said second wall.

3. The display device of claim 1, wherein said end wall slopes outwardly from said first wall to said second wall.

4. The display device of claim 3, wherein said end wall forms an angle of approximately 45° to 60° relative to, respectively, said first wall and said second wall.

5. The display device of claim 1, wherein:
said source of illumination is an electroluminescent semiconductor chip having a plurality of light-emitting regions in a surface thereof, and further comprising
a base for mounting said semiconductor chip and said cover;
a plurality of electrodes formed on said light-emitting surface, each electrode having at least an aperture therein circumscribing an exposed portion of a light-emitting region; and
conductor means connected to said electrodes for connecting said light-emitting regions to a source of electrical signals for actuating said light-emitting regions for the emission of light, said conductor means comprising an insulating tape extending between said base and said cover and mounting a plurality of conductors connected at first ends thereof to said electrodes, said conductors having second ends for connection to a source of electrical signals.

6. A semiconductor display device, comprising:
a substantially planar base;
at least one electroluminescent semiconductor chip mounted on said base, said semiconductor chip having a plurality of light-emitting regions in a surface thereof;
a plurality of electrodes formed on said light-emitting surface, each electrode having at least an aperture therein circumscribing an exposed portion of a light-emitting region, thereby dividing said light-emitting surface into a plurality of light-emitting regions;
conductor means connected to said electrodes for connecting said light-emitting regions to a source of electrical signals; and
a cover affixed to said base, said cover comprising spaced, substantially parallel first and second walls, said first wall having a plurality of optical openings therein and said second wall having an optical opening therein overlying one of said light-emitting regions of the semiconductor chip.
a plurality of optical channels, each channel formed between said first wall and said second wall by an array of three intersecting walls that form first and second side walls and one end wall to enclose triangular-shaped areas of said first wall and said second wall, one of said first wall openings being within the triangular-shaped area thereof and adjacent said end wall, and said one light-emitting region being between, and adjacent the intersection point of, said first and said second side walls, and
a light dispersing wall spanning between said first and second side walls and between said intersection point and said end wall, and sloping outwardly from said first wall point to said second wall.

7. The semiconductor display device of claim 6, wherein said light-dispersing wall is concave and curves outwardly from said first wall to said second wall.

8. The semiconductor display device of claim 6, wherein said end wall slopes outwardly from said first wall to said second wall.

9. The semiconductor display device of claim 8, wherein said light-dispersing wall and said end wall form an angle of approximately 45° to 60° relative to, respectively, said first wall and said second wall.

10. The semiconductor display device of claim 6, wherein said conductor means comprises an insulating tape extending between said base and said cover and mounting a plurality of conductors connected at first ends thereof to said electrodes, said conductors having second ends for connection to the source of electrical signals.

11. The semiconductor display device according to claim 10,
wherein said cover openings form a figure-eight configuration comprising first and second, adjoining portions, each portion being defined by a substantially rectangular array of said cover openings; and further comprising
a second electroluminescent semiconductor chip supported on said base, said first and said second chips being associated, respectively, with said first figure-eight portion and said second figure-eight portion; and
each of said cover openings being optically connected by one of said optical channels to one of said light-emitting regions.

12. The semiconductor display device of claim 6, wherein the triangular areas of said first and second walls, the said two side walls, and said light-dispersing wall are specularly reflective.

13. A semiconductor display device, comprising:
a substantially planar base;
at least one electroluminescent semiconductor chip mounted on said base, said semiconductor chip having a plurality of light-emitting regions in a surface thereof;
a plurality of electrodes formed on said light-emitting surface, each electrode having at least an aperture therein circumscribing an exposed portion of a light-emitting region, thereby dividing said light-emitting surface into a plurality of light-emitting regions;
conductor means connected to said electrodes for connecting said light-emitting regions to a source of electrical signals, said conductor means comprising an insulating tape extending between said base and said cover and mounting a plurality of conductors connected at first ends thereof to said electrodes, said conductors having second ends for connection to the source of electrical signals; and
a cover affixed to said base, said cover comprising spaced, substantially parallel first and second walls, said first wall having a plurality of optical openings therein and said second wall having an optical opening therein overlying one of said light-emitting regions of the semiconductor chip,
a plurality of optical channels, each channel formed between said first wall and said second wall by an array of three intersecting walls that form first and second side walls and one end wall to enclose triangular-shaped areas of said first wall and said second wall, one of said second wall openings being within the triangular-shaped area thereof and adjacent said end wall, and said one light-emitting region being between, and adjacent the intersection point of, said first and second side walls, a light-dispersing wall spanning between said first side wall and said second side wall and between said intersection point and said end wall, and sloping outwardly from said intersection point to said end wall, said light-dispersing wall sloping outwardly from said intersection point to said end wall, relative to said optical channel, said end wall, said first side wall, and said second side wall sloping outwardly from said first wall to said second wall, and said light-dispersing wall and said end wall forming an angle of approximately 45° to 60° relative, respectively, to said first wall and said second wall.

14. The display device of claim 1, wherein one of the substantially parallel first and second walls includes a projection extending into said optical channel for dispersing light from the source toward said first and second side walls.

15. The display device of claim 14, wherein each of said first and second walls include a projection extending into said optical channel for dispersing light from the source toward said first and second side walls.

16. The display device of claim 14, wherein said projection is hemispheric with a diameter between 1.5 and 2.5 times the thickness of said optical channel and extending into said optical channel a distance between 0.25 and 0.50 times the thickness of the optical cavity.

* * * * *